United States Patent
Wu et al.

[11] Patent Number: 6,111,245
[45] Date of Patent: Aug. 29, 2000

[54] LOW VOLTAGE REVERSE BIAS ARRANGEMENT FOR AN ACTIVE PIXEL SENSOR

[75] Inventors: Jieh-Tsorng Wu; Jeng-Long Hsu, both of Hsinchu, Taiwan

[73] Assignee: National Science Council of Republic of China, Taipei, Taiwan

[21] Appl. No.: 09/064,183

[22] Filed: Apr. 22, 1998

[51] Int. Cl.[7] ................................................. H01L 27/14
[52] U.S. Cl. ........................ 250/208.1; 257/444; 348/308
[58] Field of Search ............................ 250/208.1, 214 R, 250/214.1, 214 A; 257/291, 292, 443, 444; 348/296, 300, 301, 308

[56] References Cited

U.S. PATENT DOCUMENTS 5,841,126  11/1998  Fossum et al. ...................... 250/208.1
5,952,686  9/1999  Chou et al. ............................. 257/292

*Primary Examiner*—Que T. Le
*Assistant Examiner*—Kevin Pyo
*Attorney, Agent, or Firm*—Bacon & Thomas, PLLC

[57] ABSTRACT

An active pixel sensor is used to replace a charge coupled device (CCD) image sensor. The active pixel sensor may be operated in a low voltage environment and the power consumption is lower than that in the conventional CCD image sensor and the CMOS active pixel sensor which is now developed by current industry. The active pixel sensor of the present invention has a lower cost and may be applied to a portable system.

3 Claims, 6 Drawing Sheets

LOW VOLTAGE REVERSE BIAS ARRANGEMENT FOR AN ACTIVE PIXEL SENSOR

BACKGROUND OF THE INVENTION

The present invention relates to an active pixel sensor, and especially to an active pixel sensor operated in a low voltage environment. The power consumption of the active pixel sensor of the invention is lower than the power consumption of a conventional charge coupled device (CCD) image sensor, and also lower than the power consumption of the CMOS active pixel sensor which is now extremely developed by current commercial industry.

For many years, in the design of the image capturer and monitor, the CCD has been predominantly used due to the characteristics of lower noise, small size of pixel, etc. However, with the development of portable systems, the major concerns in the design of integrated circuits are low voltage (less cells) and low power (long working time), while in the application of CCD components, a higher voltage is needed to drive the system, and thus the difficulty in design is increased. Recently, because of the improvements in CMOS manufacturing processes, the size of device has become smaller, and thus the active pixel sensor (APS) has also further improved. Since the active pixel sensor has the advantages of lower working voltage and lower power, and is a high compact integrated circuit, it has a high commercial worth.

The conventional active pixel sensor is shown in FIG. 1. The primary characteristic thereof is that in each pixel, an amplifier circuit is used to output signals. Referring to FIG. 1, upon application of a control signal RST, the diode D1 is charged by a reverse bias voltage. During exposing, the diode D1 may be considered as an equivalent current source to charge point g0. The transistor M2 is an amplifying stage of an output amplifier. The voltage stored by point g0 is output to BL. The output of the pixel signal may then be controlled by a control signal WL. However, if the working voltage is reduced (for example, to 2V), due to the body effect, the bias voltage on point g0 will become insufficient, and thus it can not be operated under a lower voltage environment.

SUMMARY OF INVENTION

Accordingly, the object of the present invention is to provide an active pixel sensor comprising a PMOS and an adjustable cascade sensing diode so that the circuit may be operated under a voltage of 2V.

The active pixel sensor of the present invention may be used in an image capturer (such as a digital camera) under a working voltage of 2V, and it is completely compatible with the standard CMOS manufacturing process, so that it may be integrated with another application circuit (such as an analog/digital converter, a digital signal processor, etc.) so that the power of the system is reduced.

The present invention will be better understood and its numerous objects and advantages will become apparent to those skilled in the art by referencing to the following drawings in which:

DETAILED DESCRIPTION OF THE PREFERRED EMBODIMENT

Figure 1:
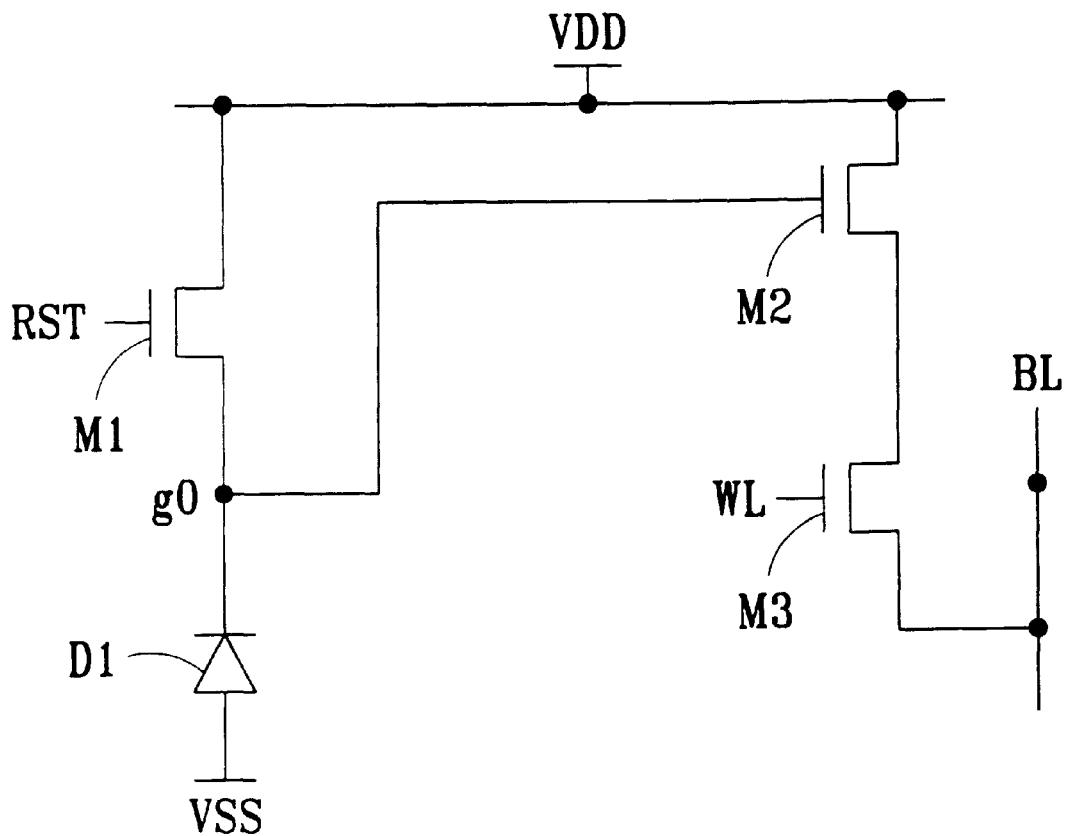
FIG. 1 is circuit diagram of a conventional active pixel sensor.
Figure 2:
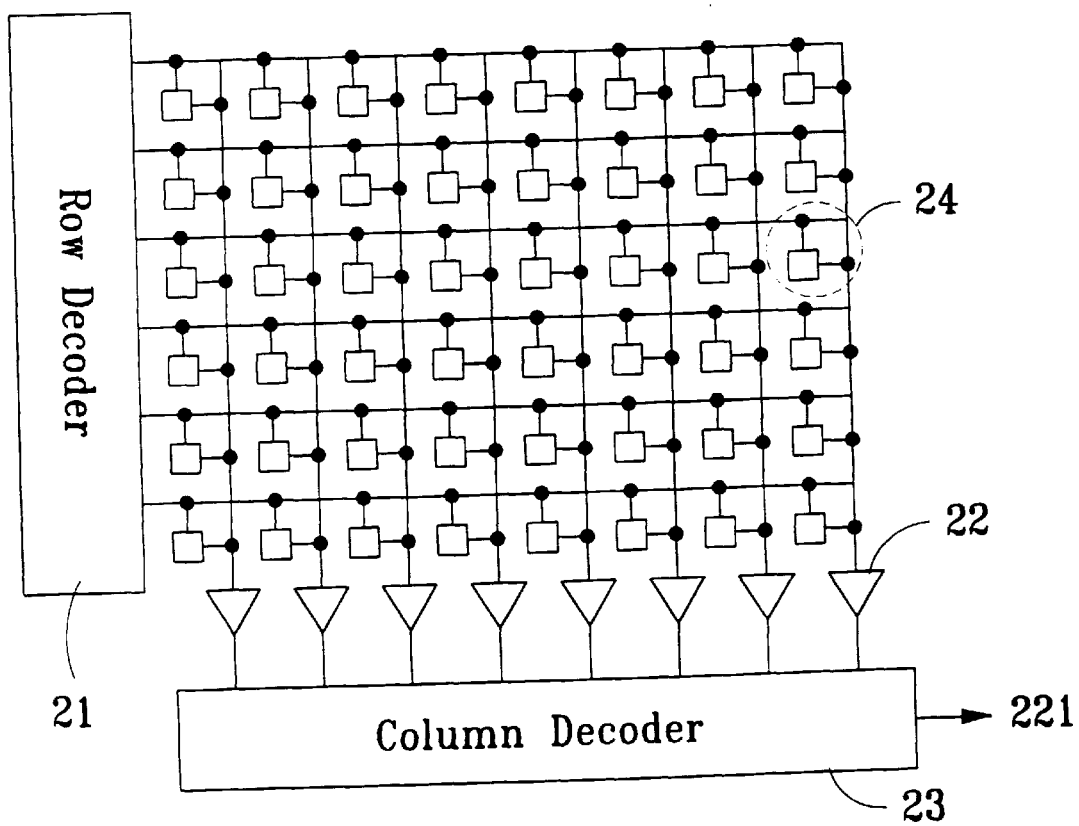
FIG. 2 is the whole structure of an image sensor.

The block diagram of the image sensor of the present invention is shown in FIG. 2. The image sensor includes a pixel array, a row decoder 21, a sensing amplifier 22 and a column decoder 23. During operation, by the random accessing of the row decoder 22 and the column decoder 23, the pixel array signal in any position is selected to output to an output port. The row decoder 22 and the column decoder 23 is designed according to the conventional circuit, and thus the description thereof is omitted herein.

Figure 3:
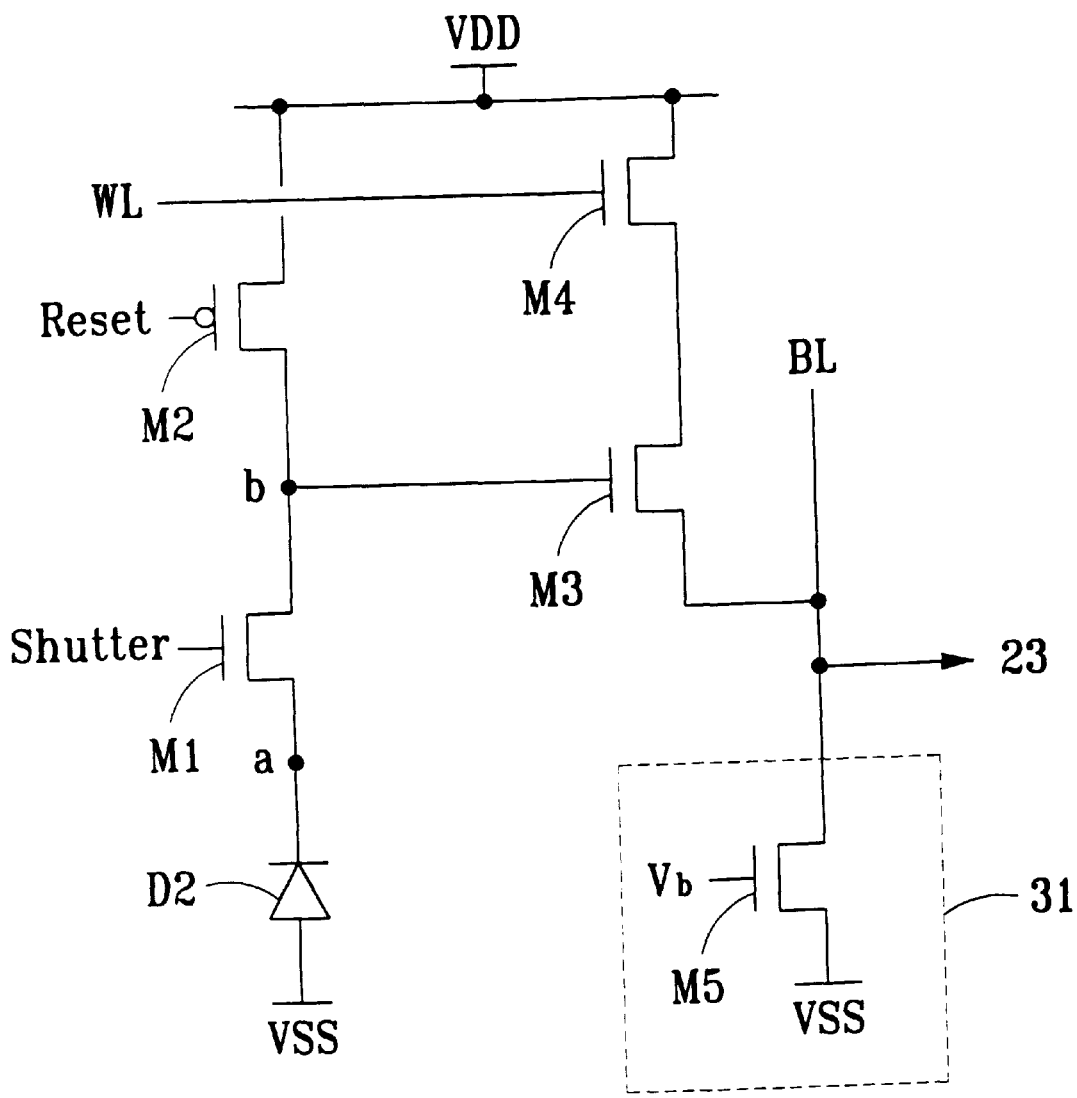
FIG. 3 is a circuit diagram of an active pixel sensor in the present invention.
Figure 4:
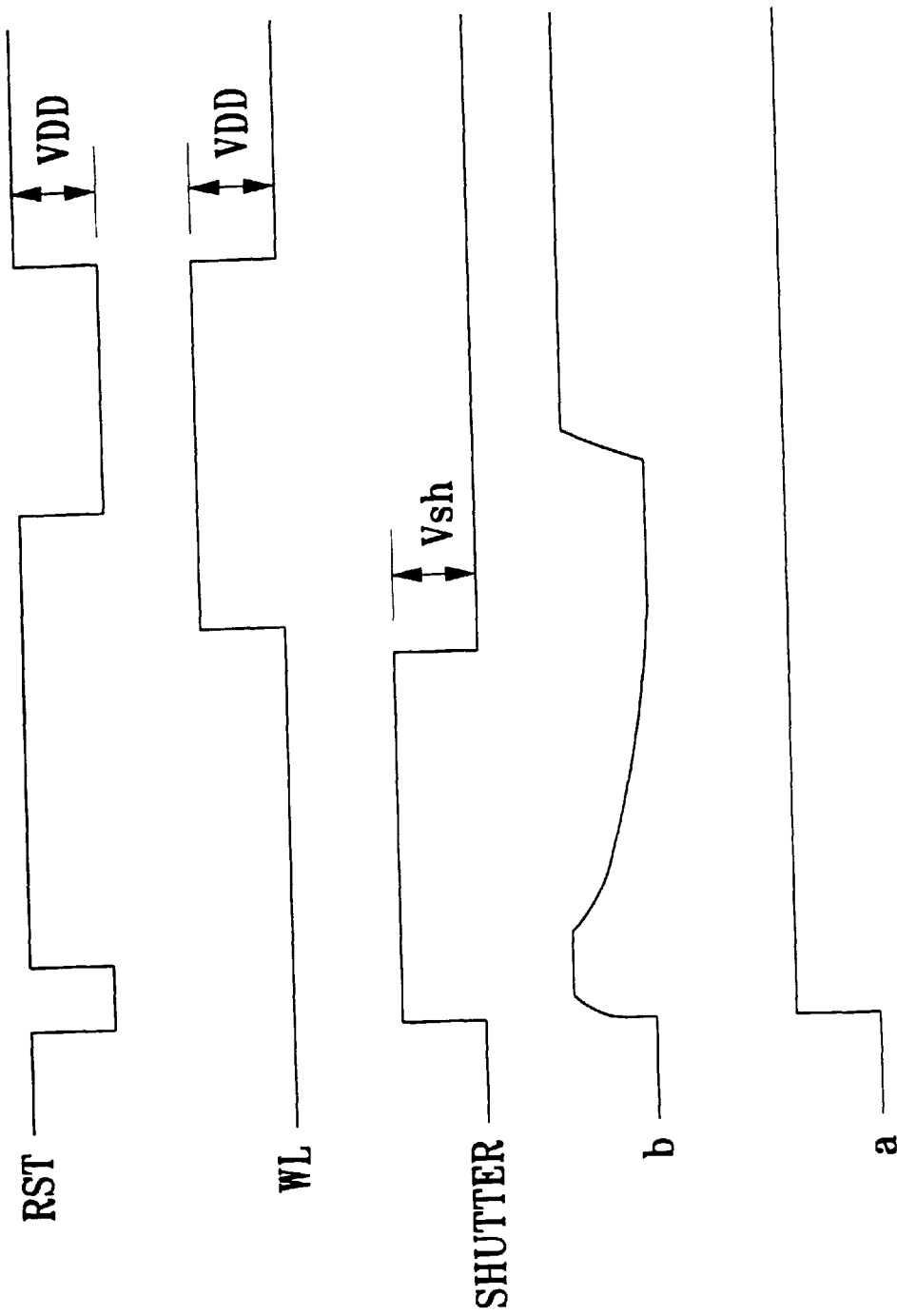
FIG. 4 is a time sequence for operating the active pixel sensor of the present invention.

The active pixel circuit of the present invention is shown in FIG. 3, wherein the reverse-biased, series connected diode D2 formed by an n type region within a p type region is used as an optic sensing component, the sensing photons thereby being converted into current. While under a DC bias Vb, the transistor M5 and diode D2 can be treated as a cascade current source 31. During operation, the diode D2 is charged to a bias voltage. As a photon is emitted into the deplete region of the diode D2, the generated electrons and holes will be separated by a electric field, and thus an photo current is formed. Then the generated charges will be stored within the point b as shown in FIG. 3. In the present invention, the charges flowing to the point b are electrons, and thus with the optic process, the voltage of point b will become lower and lower, while the transistor M2 is used as a switch for controlling the point b. During operation, RST is firstly switched to 0V to open the gate of transistor M1 the point b is charged to VDD, and then the RST signal is switched to VDD to cut off M1, as shown in FIG. 4. As it is illuminated, the magnitude of photon current is varied with the strength of light, thus the charges released from point b through the photon current is also varied, and therefore the voltage in point b is different. Now WL is switched to VDD to cause the column selecting transistor M4, to conduct, at which point the voltage of point b will be amplified through transistor M3 to output to a common position line BL. Thereafter, the RST signal will be further switched to 0V to charge the voltage in point b to VDD. Now the voltage of WL is also retained in VDD, and the VDD signal in point b is output to BL. The object is to provide a pixel signal to output to a calibration voltage level. The next sensing amplifier 23 will sample the voltage on line BL and then amplify it for output. This manner of operation is called as "correlated double sampling" (CDS)). The object of performing correlated double sampling in the stage of pixel output is to reduce the fixed-pattern noise (i.e., since the output elements of different pixels will have slight variation in size due to drift in manufacturing, the gain of different transistors is also different, and thus the same light intensity will output different voltage values on different pixels.)

In the present invention, in general, the active pixel is connected with the light sensing diode D2 through n type MOS transistor M1, which serves as a serial electronic shutter for (1) separating the light sensing diode D2 and the point b by transistor M1, so that the pulse width of a SHUTTER is controlled to decide the time duration of light illumination; as the signal on point b is outputted, the SHUTTER will be switched to 0V, and thus the voltage on point b will not be affected by the photon current generated by the illumination of diode D2. (2) the voltage of the SHUTTER may be modulated because, as shown in FIG. 4, Vsh is controlled by outer components, and therefore, the reversing bias voltage of the diode D2 will also be controlled, and the transistor M1 and the diode D2 are formed as a cascade current source; through the control of Vsh voltage, the reversing bias of the diode D2 may be controlled, and thus the sensitivity of the circuit is adjusted (since the size of the reversing bias of the diode D2 will decide the electric field of the depletion region; the higher the electric field, the easier the collision between the photons and the sensing crystal lattices for forming a photon circuit) for matching a background with different illumination.

In the present invention, the transistor M2 should be a PMOS component, since as the working voltage VDD is reduced (for example VDD is equal to 2V), if the transistor M2 is made by an NMOS component, due to the body effect, the voltage on point b will be less than VDD with the value of Vt. Thus, if Vt is equal to 0.8V, VDD is 2V, the voltage on point b is equal to 1V, the transistor M1 will work on a non-saturation region, and the whole circuit will lose its function. Therefore, if the transistor M2 is made by PMOS, the body effect will be avoided, then the circuit is more easily to be operated in the lower voltage condition.

Figure 5:
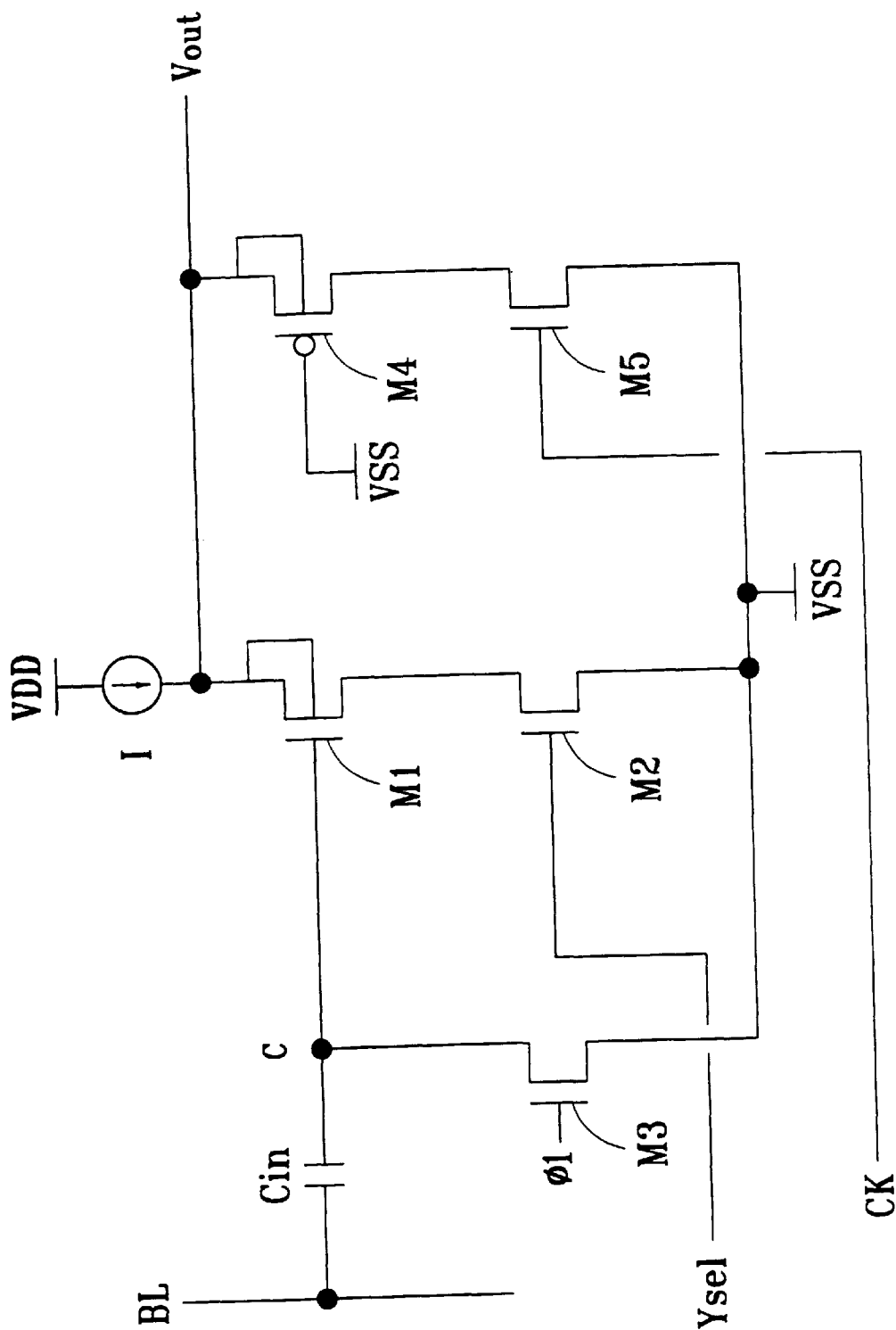
FIG. 5 is a circuit of a sensing amplifying circuit.
Figure 6:
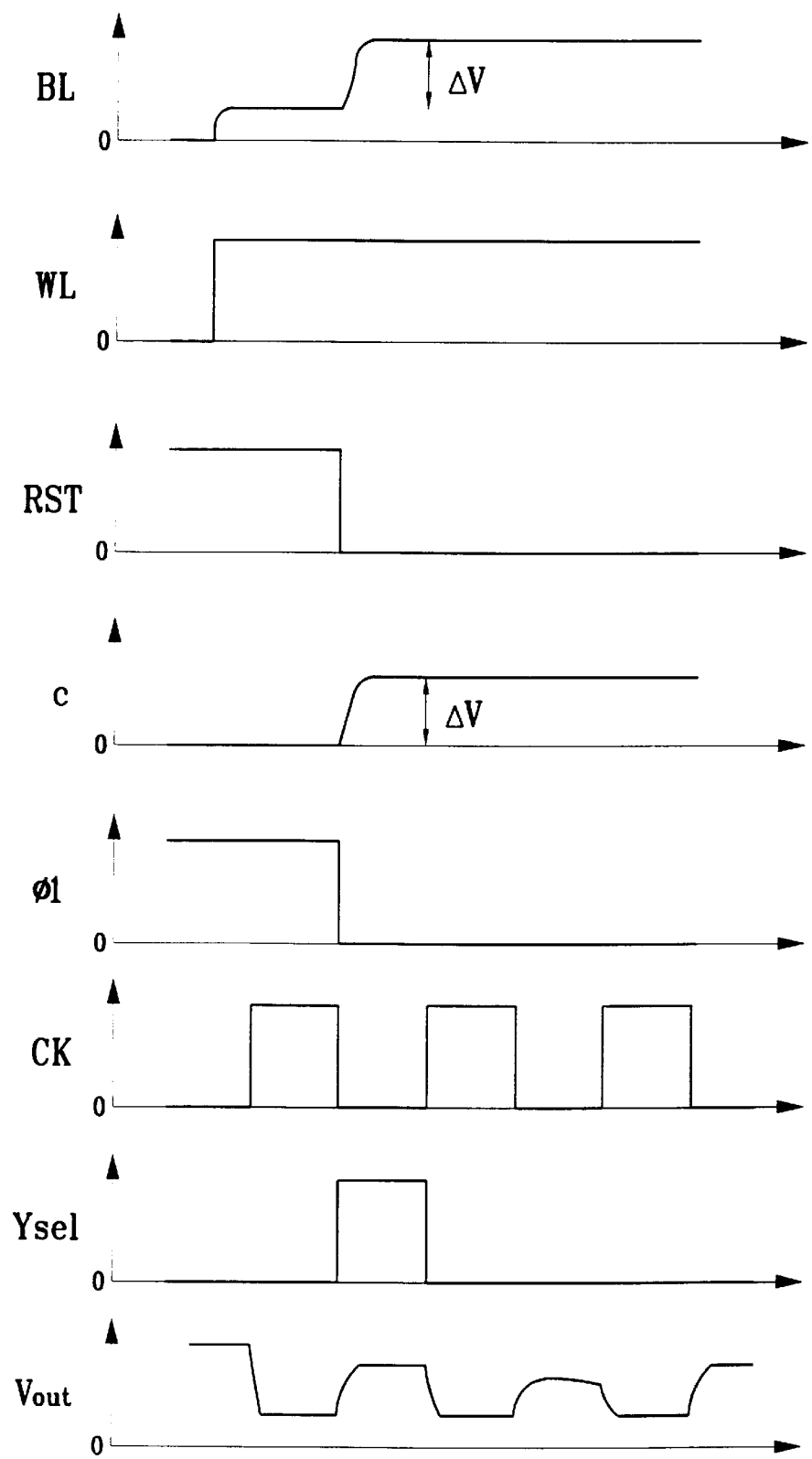
FIG. 6 is a time sequence of a sensing amplifying circuit.

When the light has cut off, the signals of pixels are outputted in parallel, i.e., the pixels on the same line are outputted signals having a common address BL. The pixels on the same line use the same sensing amplifier (as that shown in dashed lines) for amplifying signals, and all of the amplifiers use a common output port for outputting signals. The circuit of the sensing amplifier connected on each line is shown in FIG. 5. The transistor M1 shown in this figure is the input port of this sensing amplifier. The transistor M2 is a channel control switch for controlling the operation of the sensing amplifier. The the transistors M4 and M5 are commonly used by many lines for providing a reset voltage to an output port. The time sequence of the whole signals are shown in FIG. 6. When W1 is equal to VDD, the column selecting transistor M4 shown in FIG. 3 is open and the pixel signal is stored in BL, then φ1 is equal to VDD, voltage follower transistor M3 is open, and the voltage of point c is 0V. At the same time, CK is equal to VDD, and the column selecting transistor M4 is open. Now the current will flow through the transistors M4 and M5. The voltage value Vout is equal to that of the current source multiplied by an equivalent resistance between the source and drain of transistor M4. This voltage may be used as a reference voltage for a measuring circuit by an external component. Then, signal of RST is switched to 0V by VDD, and meanwhile the φ1 is also switched to 0V, after which transistor M3 is cut off, and the voltage of BL will be higher than before. Therefore, by the coupling effect of the capacitor Cin, the voltage on point C is equal to the voltage difference ΔV across the BL as shown in FIG. 6. Thereby, Ysel will be switched to VDD (the Ysel is from the column decoder being used to output the signal on some line), transistor M2 is opened, simultaneously CK is 0V, and thus transistor M2 is opened. The voltage value of Vout is equal to that of current source I multiplied by an equivalent resistance between the source and drain of transistor M4. By this operating sequence, the outer sampling circuit can derive a pixel signal and a reference signal Vref through the operation of pulse Ck for meeting the respective dual sampling so to delete the pixel noise.

Although certain preferred embodiment of the present invention has been shown and described in detail, it should be understood that various changes and modification may be made therein without departing from the scope of the appended claims.

What is claimed is:

1. An active pixel sensor, comprising:

a photon receiver formed by an n type region within a p type region;

a serial electronic shutter formed by an n type MOS transistor having a source connected to the photon receiver and a drain connected in series with a drain of a p type MOS transistor;

a reset transistor formed by a p type MOS transistor having a source connected with a positive power source and a drain connected with the drain of the n type MOS transistor of the electronic shutter;

a voltage follower including a transistor having a gate connected with the drain of the p type MOS transistor, a source of said voltage follower transistor serving as the output port of the n type MOS transistor and the drain of the voltage follower transistor being connected with a column selecting transistor;

wherein said column selecting transistor is formed by an n type MOS transistor having a source connected with the drain of the voltage follower transistor and a drain connected to a positive power source; and wherein the photon receiver is a light sensitive electrode for converting collected photons into current.

2. An active pixel sensors comprising:

a photon receiver including a sensing diode formed by an n type region within a p type region;

a serial electronic shutter formed by an n type MOS transistor having a source connected to the photon receiver and a drain connected in series with a drain of a p type MOS transistor;

a reset transistor formed by a p type MOS transistor having a source connected with a positive power source and a drain connected with the drain of the n type MOS transistor of the electronic shutter;

a voltage follower including a transistor having a gate connected with the drain of the p type MOS transistor, a source of said voltage follower transistor serving as the output port of the n type MOS transistor and the drain of the voltage follower transistor being connected with a column selecting transistor;

wherein said column selecting transistor is formed by an n type MOS transistor having a source connected with the drain of the voltage follower transistor and a drain connected to a positive power source; and wherein a voltage supplied to a gate of the n type MOS transistor of the serial electronic shutter is adjustable, said voltage being in the form of pulses, a pulse width of said pulses determining an exposing time duration, and a voltage of said pulses determining a magnitude of a reverse bias voltage of the sensing diode and therefore the sensitivity of the sensing diode to light.

3. An active pixel sensors comprising:

a photon receiver formed by an n type region within a p type region;

a serial electronic shutter formed by an n type MOS transistor having a source connected to the photon receiver and a drain connected in series with a drain of a p type MOS transistor;

a reset transistor formed by a p type MOS transistor having a source connected with a positive power source and a drain connected with the drain of the n type MOS transistor of the electronic shutter;

a voltage follower including a transistor having a gate connected with the drain of the p type MOS transistor, a source of said voltage follower transistor serving as the output port of the n type MOS transistor and the drain of the voltage follower transistor being connected with a column selecting transistor;

wherein said column selecting transistor is formed by an n type MOS transistor having a source connected with the drain of the voltage follower transistor and a drain connected to a positive power source; and wherein the reset transistor is arranged to control a reverse bias of the photon receiver and provide a calibration voltage required by a pixel signal output.

* * * * *